(12) United States Patent
MacDonald

(10) Patent No.: US 6,934,647 B2
(45) Date of Patent: Aug. 23, 2005

(54) EFFICIENT SAMPLING OF DIGITAL WAVEFORMS FOR EYE DIAGRAM ANALYSIS

(75) Inventor: Willard MacDonald, Bolinas, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/278,339

(22) Filed: Oct. 22, 2002

(65) Prior Publication Data

US 2004/0078158 A1 Apr. 22, 2004

(51) Int. Cl.[7] ............................................. G06F 19/00
(52) U.S. Cl. ..................... 702/66; 702/70; 702/179; 700/55; 714/709; 708/422; 708/290; 382/113; 382/190
(58) Field of Search ............................. 702/66–67, 70, 702/73, 81, 86, 179, 189–190; 700/55; 714/25, 709; 708/422, 290; 382/113, 190

(56) References Cited

U.S. PATENT DOCUMENTS

| | | | | |
|---|---|---|---|---|
| 5,978,742 | A | * 11/1999 | Pickerd | 702/66 |
| 6,546,345 | B1 | * 4/2003 | Ghiasi | 702/67 |
| 6,748,338 | B2 | * 6/2004 | Cheng | 702/108 |
| 2003/0083833 | A1 | * 5/2003 | Nygaard | 702/67 |
| 2003/0165259 | A1 | * 9/2003 | Balent et al. | 382/113 |
| 2003/0220753 | A1 | * 11/2003 | Pickerd et al. | 702/67 |

OTHER PUBLICATIONS

Takara et al., 'Eye–diagram Measurement of 100 Gbit/s Optical Signal using Optical Sampling', Jan. 1996, EOC, pp. 4.7–4.10.*

Jenq, 'Perfect Reconstruction of Digital Spectrum from Non–Uniformly Sampled Signals', Jun. 1997, IEEE Article, vol.:46, No. 3, pp. 649–652.*

Ziperovich, 'Performance Degradation of PRML Channels Due to Nonlinear Distortions', Nov. 1991, IEEE, pp. 4825–4827.*

Jayamsimaha et al., 'Design of Nyquist and Near–Nyquist Pulses with Spectral Constraints', Jan. 2000, Signion, pagges 1–6.*

* cited by examiner

Primary Examiner—Hal Wachsman
Assistant Examiner—Elias Desta

(57) ABSTRACT

Method and apparatus for determining at least one characteristic of a digital data signal. The method includes identifying at least one region of a waveform such as an Eye Diagram that contains information for determining at least one characteristic of interest of the digital data signal. Sufficient samples of the digital data signal are then taken to fully construct only the identified at least one region of the Eye Diagram without fully constructing the entire Eye diagram, and the at least one characteristic of interest is then determined from the fully constructed at least one region of the Eye Diagram.

27 Claims, 6 Drawing Sheets

US 6,934,647 B2

EFFICIENT SAMPLING OF DIGITAL WAVEFORMS FOR EYE DIAGRAM ANALYSIS

BACKGROUND OF THE INVENTION

1. Technical Field of the Invention

The present invention relates generally to the measurement of digital signals; and, more particularly, to a method and apparatus for determining characteristics of a digital data signal utilizing Eye Diagram analysis.

2. Description of Related Art

Eye Diagram analysis is an important tool for studying the behavior of high-speed digital electrical and optical communications signals. An Eye Diagram is a way of displaying, on an oscilloscope or other suitable display device, a composite image of the waveform shapes of logic one-zero combinations of a digital data signal. An Eye Diagram is generated on an oscilloscope by applying the waveform to the vertical channel of the oscilloscope while triggering from a synchronous clock signal at, for example, the data rate of the digital signal Eye Diagrams of high speed digital signals are often generated using an equivalent-time sampling oscilloscope (e.g., the Agilent Technologies 86100B sampling oscilloscope). By measuring features of the generated Eye Diagram, various characteristics of a digital data signal, such as signal-to-noise ratio, extinction ratio, jitter, duty cycle distortion, and the like, can be readily determined.

The construction of a complete Eye Diagram may require from 200,000 to 1,000,000 samples, and tens of seconds may be required to acquire this amount of data. Such a length of time can negatively affect the efficiency and profitability of component and system manufacturers and others that use Eye Diagram analysis.

There is, accordingly, a need for a method and apparatus for efficiently determining characteristics of a digital data signal using Eye Diagram analysis.

SUMMARY OF THE INVENTION

The present invention provides an efficient method and apparatus for determining characteristics of a digital data signal utilizing Eye Diagram analysis.

A method for determining at least one characteristic of a digital data signal according to the present invention includes identifying at least one region of an Eye Diagram that contains information for determining at least one characteristic of interest of the digital data signal. Sufficient samples of the digital data signal are then taken to fully construct only the identified at least one region of the Eye Diagram without fully constructing the entire Eye Diagram, and the at least one characteristic of interest is then determined from the fully constructed at least one region of the Eye Diagram.

The present invention recognizes that many characteristics of a digital data signal are determined by utilizing information contained in only one or a few regions of an Eye Diagram. The present invention, accordingly, fully constructs only the region or regions of an Eye Diagram that are needed to determine a particular characteristic of interest of the digital data signal, and does not fully construct other regions of the Eye Diagram. As a result, a particular characteristic of interest of a digital data signal can be accurately determined from an Eye Diagram that is constructed from fewer samples of the digital data signal than would be required to fully construct an entire Eye Diagram; and this can result in a significant reduction in sampling time.

According to exemplary embodiments of the present invention, characteristics of a digital data signal such as extinction ratio, contrast ratio, overshoot, undershoot, one and zero level, signal-to-noise ratio, risetime, falltime, bit rate, crossing percentage, jitter, duty cycle distortion, Eye height, Eye width, Eye amplitude, and optical modulation amplitude (OMA) can readily be determined by fully constructing only the region or regions of an Eye Diagram that are needed to permit the necessary measurements to be made.

According to another exemplary embodiment of the present invention, the identifying step comprises identifying at least one region of an Eye diagram that is close to at least one mask region superimposed on the Eye Diagram, and the determining step comprises determining at least one characteristic of interest of the digital data signal with respect to the at least one mask region.

By concentrating samples only in a region or regions of an Eye Diagram that are close to a superimposed mask region, a more efficient distribution of samples can be taken to accurately determine, for example, if a particular product under test passes a mask test and, if so, the margin by which the product passes the mask test. Furthermore, the invention provides embodiments with other features and advantages in addition to or in lieu of those discussed above. Many of these features and advantages are apparent from the description below with reference to the following drawings.

DETAILED DESCRIPTION OF THE EXEMPLARY EMBODIMENTS OF THE INVENTION

Figure 1:
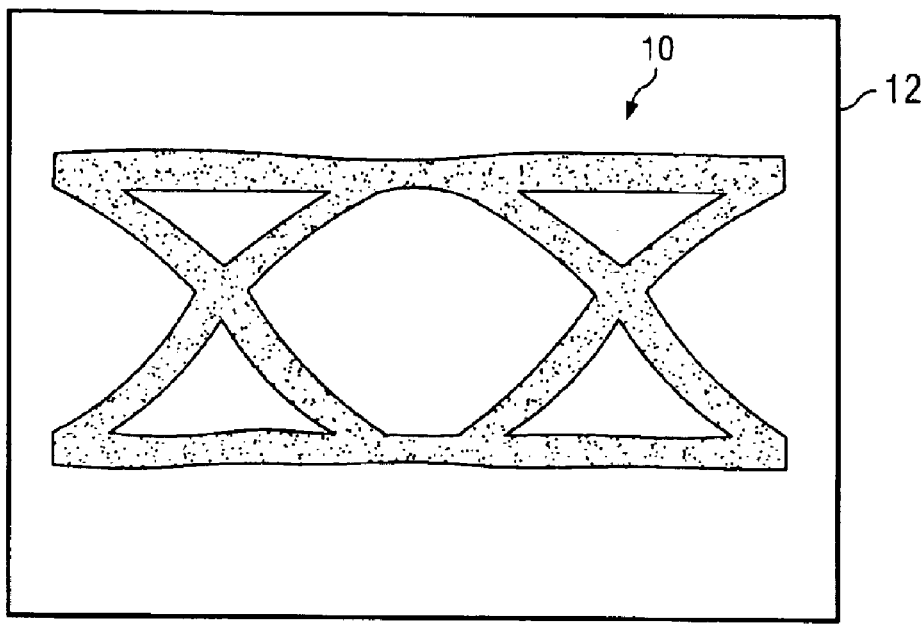
FIG. 1 schematically illustrates an exemplary Eye Diagram that represents characteristics of a digital data signal to assist in explaining the present invention.

FIG. 1 schematically illustrates an exemplary Eye Diagram that represents characteristics of a digital data signal, such as a digital optical or electrical communications signal, to assist in explaining the present invention. The Eye Diagram is generally designated by reference number 10, and is displayed on a display of a suitable sampling apparatus, for example, on display screen 12 of a sampling oscilloscope.

Eye Diagram 10 is a composite image of the waveform shapes of logic one-zero combinations of a digital data signal, and is generated by applying the waveform to the vertical channel of a sampling oscilloscope while triggering from a synchronous clock signal at, for example, the data rate of the digital data signal. By measuring features of Eye Diagram 10, various characteristics of the digital data signal can be readily determined.

At data rates below about 1 Gb/s, a real-time sampling oscilloscope is commonly used to generate an Eye Diagram, such as Eye Diagram 10 in FIG. 1. A real-time sampling oscilloscope employs a very high speed A/D converter to capture a waveform record consisting of a complete sequence of successive data bits Real-time sampling allows one to see, for example, characteristics of the data pattern that precedes a waveform error such as, for example, slow risetime or excessive overshoot. An Eye Diagram can be generated by a real-time sampling oscilloscope by locating edges and overlaying bits on top of each other.

The A/D converter in a real-time sampling oscilloscope samples the waveform much faster than the data rate. Commercial real-time sampling oscilloscopes, for example, may employ sampling rates of 4–10 times the data rate. Commercial real-time sampling oscilloscopes are typically limited to a bandwidth of about 2 GHz and a data rate of about 1 Gb/s. For higher data rates, an equivalent-time sampling oscilloscope is used to construct an Eye Diagram. In an equivalent-time sampling oscilloscope, each trigger event causes the oscilloscope to take a single sample of the data waveform and to display the sample as a single point on the display screen. Each subsequent sample point (following a new trigger event) is increasingly delayed relative to the time of the trigger. After numerous trigger events, the oscilloscope fills the display screen with an Eye Diagram that comprises a sampled representation of the waveform.

It may require from about 200,000 samples to about 1,000,000 samples to fully construct an entire Eye Diagram, such as Eye Diagram 10 in FIG. 1, that accurately represents a digital communications signal. Tens of seconds may be required to acquire this amount of data, and it would be desirable to provide an efficient technique for determining characteristics of a digital data signal that may provide for a reduction in this test time.

The present invention recognizes that many characteristics of a digital data signal can be determined by measuring features contained in only one or a few regions of an Eye Diagram. Accordingly, it is only necessary to fully construct the particular region or regions of an Eye Diagram that contains the features that must be measured in order to permit particular characteristics of interest to be determined; and it is not necessary to fully construct the entire Eye Diagram.

Figure 2:
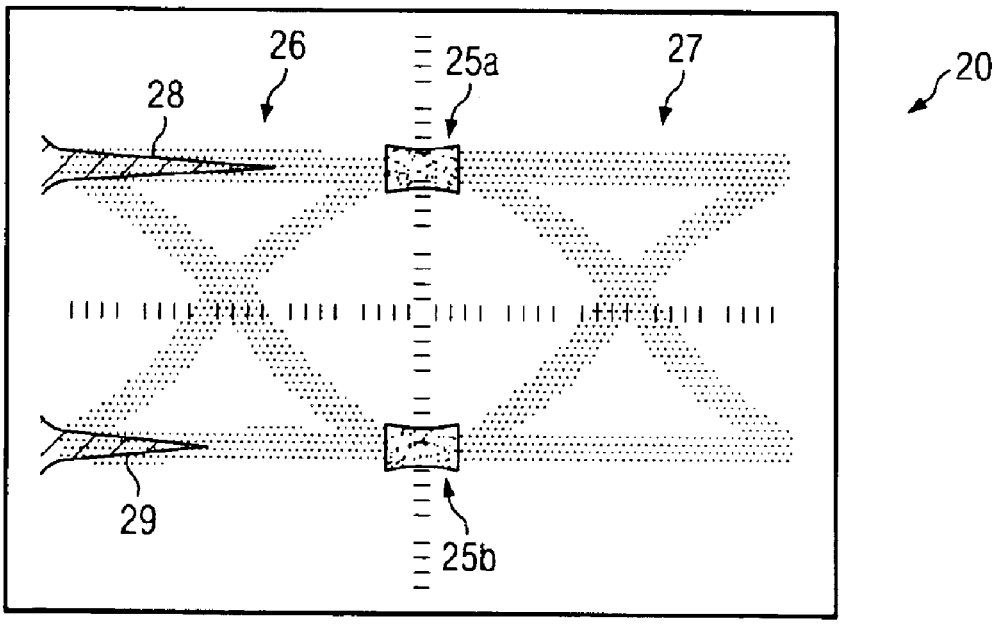
FIG. 2 schematically illustrates an Eye Diagram according to an embodiment of the present invention.

For example, the extinction ratio of a digital data signal is commonly determined by building histograms around the central twenty percent of an Eye Diagram and measuring the one and zero levels by locating the means of the two resulting histograms. Accordingly, only samples that fall within the central twenty percent of the Eye Diagram are relevant to the determination of extinction ratio, and only that region of the Eye Diagram needs to be fully constructed by taking a large number of samples (since accurately measuring the one and zero level, especially the zero level, requires many samples). Other samples that would normally be taken to fully construct an entire Eye Diagram are not required for this particular measurement; and, thus, except for taking a limited number of samples to locate the central twenty percent of the Eye relative to the one and zero crossings (as will be explained hereinafter), are not needed FIG. 2 schematically illustrates an Eye Diagram 20 that may be used to determine the extinction ratio of a digital data signal according to an embodiment of the present invention. Eye Diagram 20 is constructed by first taking a few samples to roughly define the entire Eye Diagram 20 so that regions 25a and 25b of interest of Eye Diagram 20 can be identified; and then by taking a sufficient number of samples in regions 25a and 25b to fully construct the regions Thus, as shown in FIG. 2, Eye Diagram 20 comprises fully constructed region 25a and 25b, and regions 26 and 27 that are only partially constructed Fully constructed regions 25a and 25b comprise typically the central twenty percent of the bit period (in between crossings), and because regions 25a and 25b are fully constructed, histograms, schematically illustrated at 28 and 29, can be built using data in regions 25a and 25b from which the extinction ratio of the digital data signal can be accurately determined.

It should be understood that the term "fully constructed" as used herein generally refers to the taking of a sufficient number of samples to accurately construct an entire Eye Diagram or to accurately construct a region of an Eye Diagram from which measurements can be made to accurately determine characteristics of interest of a digital data signal. The number of samples that may be needed to fully construct an entire Eye Diagram or to fully construct a region of an Eye Diagram may vary depending, for example, on particular characteristics of interest to be determined and on accuracy requirements of a user.

It should also be understood that the term "entire Eye Diagram" is used herein to describe an Eye Diagram that includes all regions, such as the Eye Diagram in FIG. 1. The Eye in FIG. 1 shows two edge crossings and comprises approximately 1.6 UI (unit intervals) meaning that it is a display of 1.6 bit periods of the data signal. An entire Eye Diagram, may however, comprise more or less than 1.6 UI, but is typically greater than or equal to 1 UI and less that 2 UI. An Eye of more than 1 UI has redundant data samples, and therefore provides no additional information about the data signal. Despite this, these additional redundant samples are usually included in Eye Diagrams for clarity and to make certain measurements less complicated. For this reason, the term "entire Eye Diagram" is used herein to mean all regions that make up at least 1 UI of data.

Also, the Eye of FIG. 1 is shown to be centered in the display area with its two edge crossing regions equally spaced on the left and right. Showing two crossing regions with the crossing oriented on either side of the display is the typical orientation of an Eye Diagram, however, the preferred embodiment of the present invention works equally well on an Eye Diagram that is not centered as such, but is positioned, for example, with a single crossing region oriented in the center of the display, or in some other position.

The Eye Diagram of FIG. 1 is an NRZ or non-return-to-zero Eye generated from an NRZ data signal. An Eye need not necessarily be only of this form. The preferred embodiment of the present invention works equally well with other signaling formats such as RZ (return-to-zero), and multi-level modulation Eyes generated from data signals that use more than two signal levels.

In an exemplary embodiment of the invention illustrated in FIG. 2, only about 2,000 or so samples are taken to roughly define the entire Eye Diagram 20. By concentrating the remaining samples in regions 25a and 25b, comprising the central twenty percent of the bit period, therefore, approximately eighty-eight percent less data is required to determine the extinction ratio of a digital data signal than would be required if the entire 1.6 unit interval Eye Diagram were fully constructed. This results in a reduction in overall test time of about eighty-eight percent. In an exemplary embodiment wherein 1,000,000 samples would be taken to fully construct an entire Eye Diagram, only about 120,000 samples are needed to fully construct regions 25a and 25b of the Eye Diagram.

Other characteristics of a digital data signal can also be determined by using data contained in only the central twenty percent of a bit period in an Eye Diagram. For example, measurements to determine one and zero level, signal-to-noise ratio, Eye height and Eye amplitude can also be made using only regions 25a and 25b of Eye Diagram 20.

Figure 3:
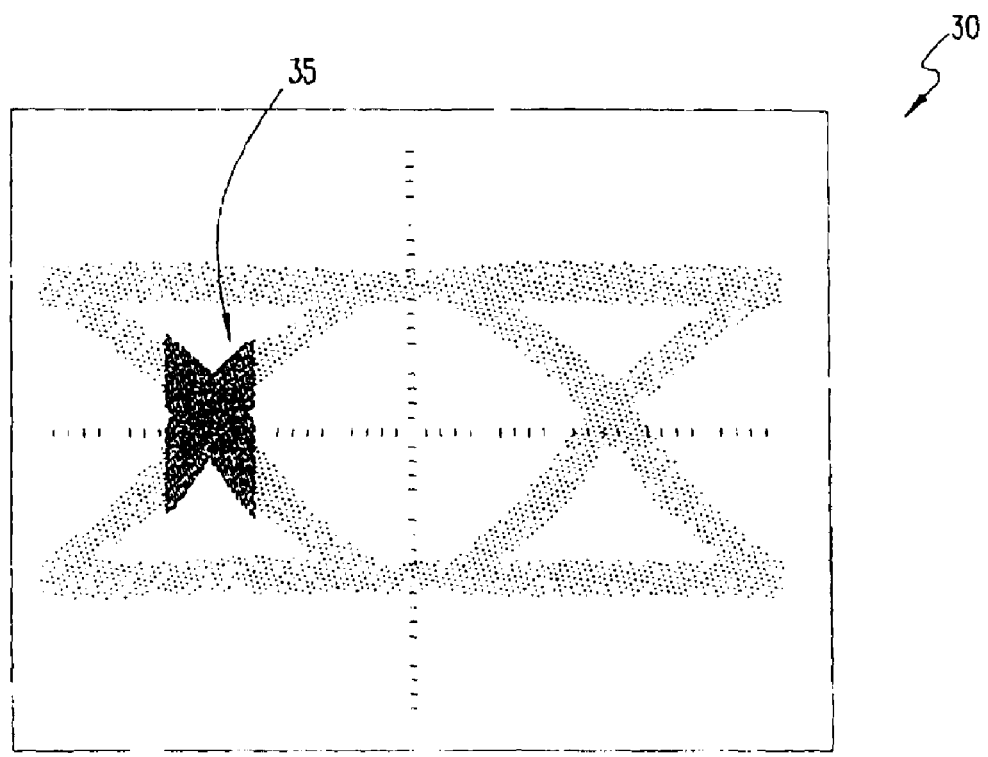
FIG. 3 schematically illustrates an Eye Diagram according to another embodiment of the present invention.
Figure 4:
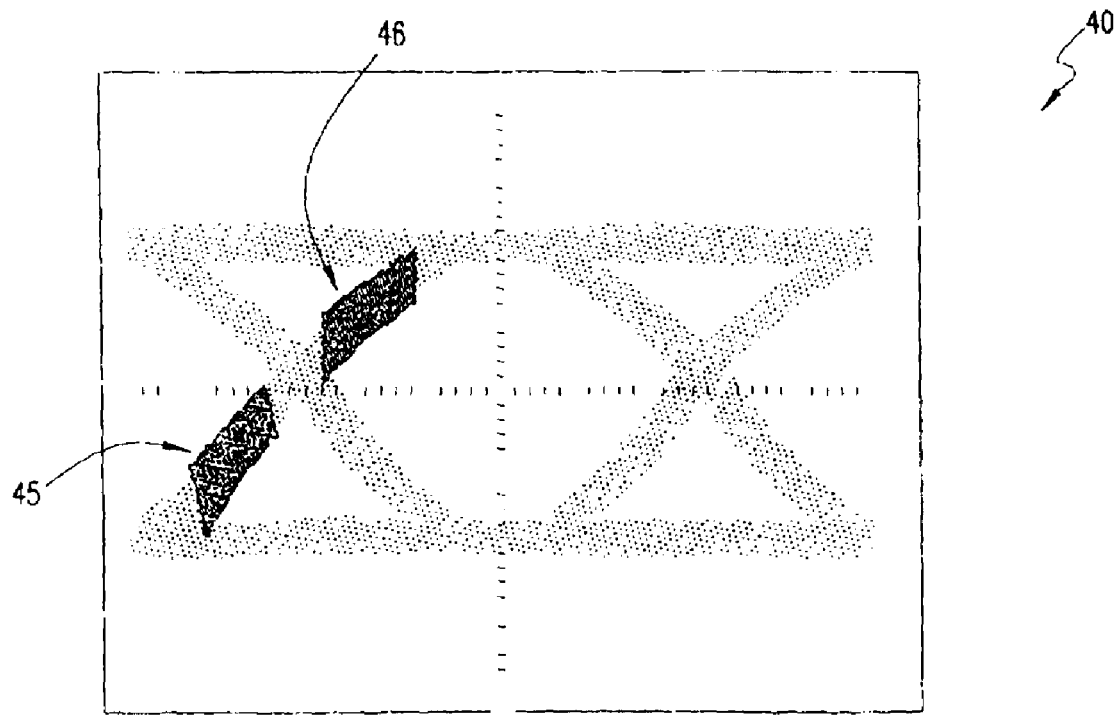
FIG. 4 schematically illustrates an Eye Diagram according to another embodiment of the present invention.
Figure 5:
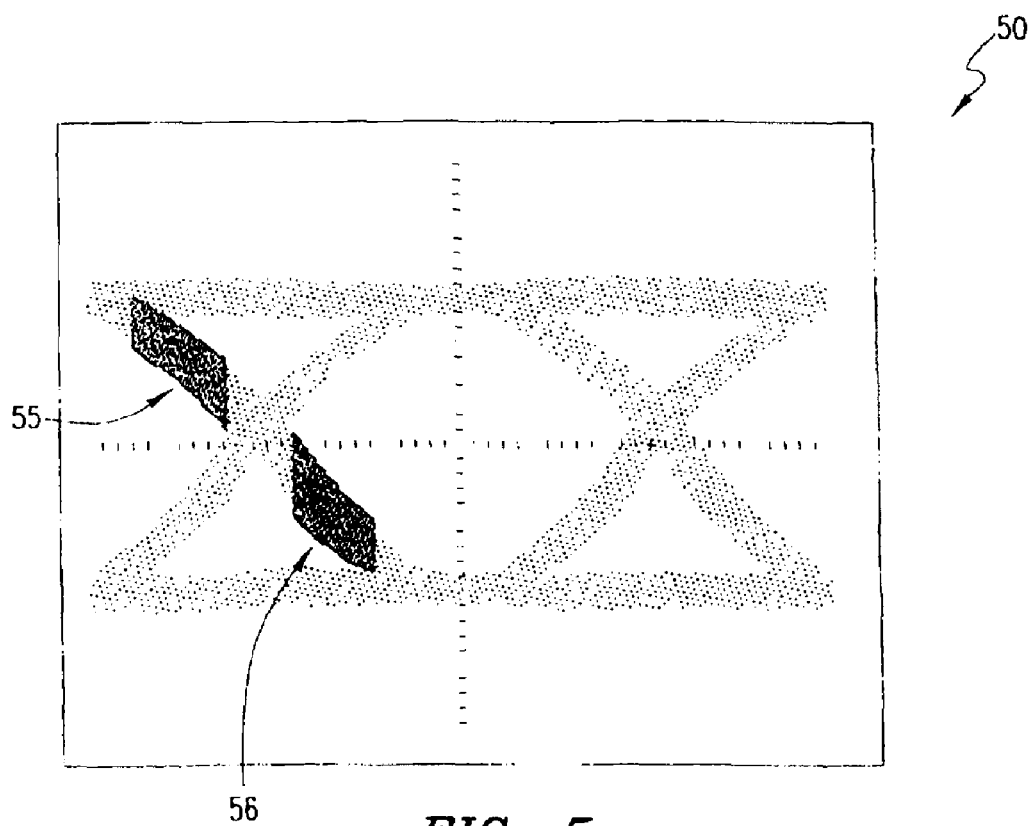
FIG. 5 schematically illustrates an Eye Diagram according to another embodiment of the present invention.
Figure 6:
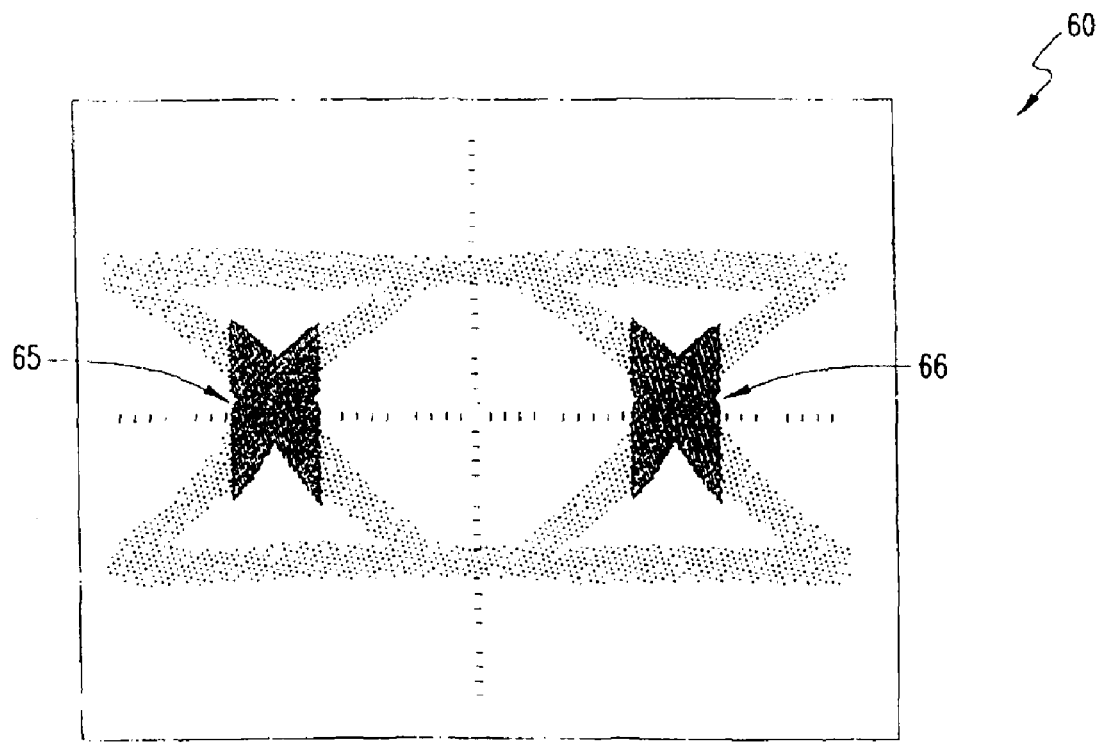
FIG. 6 schematically illustrates an Eye Diagram according to another embodiment of the present invention.

To determine other characteristics of a digital data signal, other regions of an Eye Diagram are fully constructed. For example, as shown in FIG. 3, jitter can be determined by concentrating samples in region 35 of Eye Diagram 30. As shown in FIG. 4, risetime can be determined by concentrating samples in regions 45 and 46 of Eye Diagram 40; and as shown in FIG. 5, falltime can be determined by concentrating samples in regions 55 and 56 of Eye Diagram 50. As shown in FIG. 6, bit rate and eye width can be determined by concentrating samples in regions 65 and 66 of Eye Diagram 60.

As is apparent from FIGS. 2–6, many characteristics of a digital data signal can be determined by constructing only a relatively small region or regions of an Eye Diagram.

Some characteristics of a digital data signal can be determined using some combination of the regions illustrated in the Eye Diagrams of FIGS. 2-6 or some combination of other regions of an Eye Diagram. For example, Crossing Percentage can be determined from data collected to determine both one and zero level and jitter. The determination of duty cycle distortion also requires the same data as used to determine one and zero level and jitter, however, the data collected around the crossings may need to be increased if the duty cycle distortion is large.

Another common method for determining characteristics of a digital data signal is a "mask test". Traditionally, a mask test is conducted by taking enough samples of a digital data signal to fully construct an entire Eye Diagram, and then superimposing a mask or template of "keep out" regions over the constructed Eye Diagram. If one or more samples violate the mask by falling inside a mask region, for example, the test fails.

Figure 7:
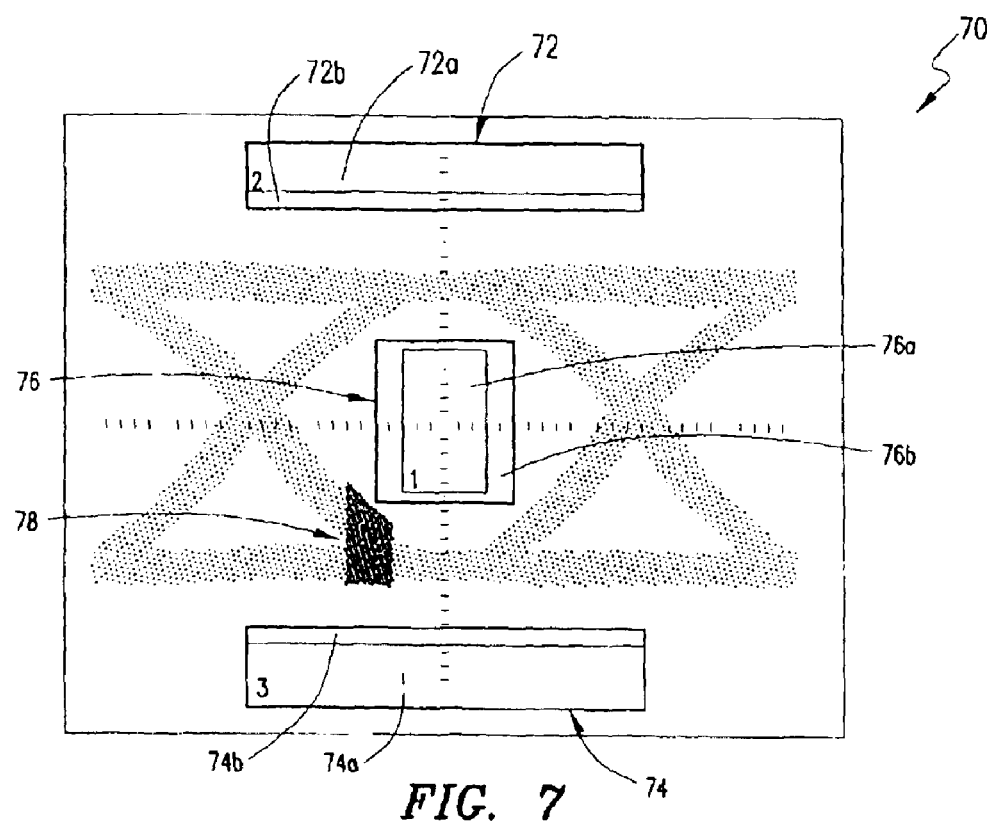
FIG. 7 schematically illustrates an Eye Diagram according to another embodiment of the present invention.

According to an embodiment of the present invention, an Eye Diagram is fully constructed only in a region or regions of the Eye Diagram that are close to violating a mask region. For example, FIG. 7 illustrates Eye Diagram 70 having a plurality of mask regions 72, 74 and 76 superimposed thereon. In FIG. 7, areas 72a, 74a and 76a of each mask region comprise a mask, and areas 72b, 74b and 76b of each mask region comprise a mask margin.

As also shown in FIG. 7, a region 78 of Eye Diagram 70 is close to mask region 76. Accordingly, by concentrating the samples in region 78, characteristics of the digital data signal with respect to the mask regions, e.g., whether or not samples fall within a mask or mask margin, can be ascertained. The remainder of Eye Diagram 70 is not close to a mask region; and, accordingly, it is not necessary to fully construct the remainder of Eye Diagram 70 as information contained therein is not important for the mask test. In an exemplary embodiment of the invention, a small number of samples of the entire Eye Diagram 70 are taken to permit the masks to be properly positioned and to identify regions that are close to a mask; and then a larger number of samples are taken to construct the close regions. A region such as region 78 in FIG. 7 can be accurately constructed by taking only about 12,000 samples, requiring about 300 ms to generate; as compared, for example, to taking about 500,000 samples to fully construct an entire Eye Diagram, requiring about 13 seconds to generate. In this regard, it should be recognized that other Eye Diagrams may have another region or a plurality of regions that are close to a mask, and a greater number of samples might be required to fully construct such regions. Again, however, it is not necessary to fully construct an entire Eye Diagram.

Figure 8:
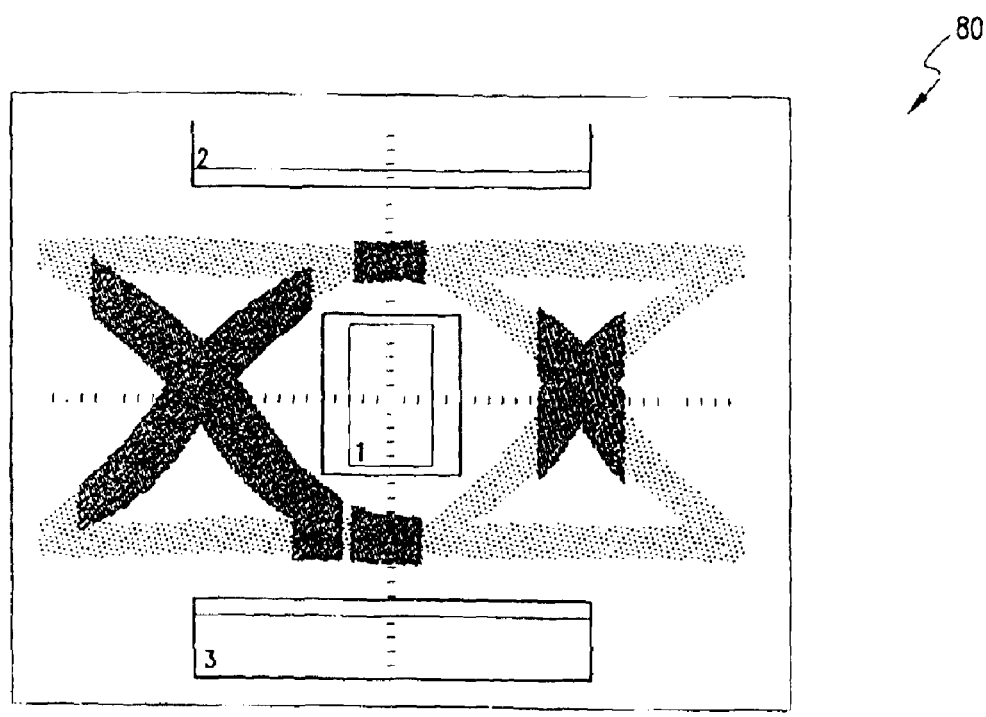
FIG. 8 schematically illustrates an Eye Diagram according to another embodiment of the present invention.

FIG. 8 schematically illustrates an Eye Diagram 80 in which all of the regions illustrated in FIGS. 2–7 are fully constructed so as to enable all common Eye measurements to be performed. As should be apparent from FIG. 8, even in this "worst case" scenario, only about fifty percent of the data needed to fully construct an entire Eye Diagram is needed (although the exact percentage can vary depending on which and how many regions of the Eye Diagram are near mask violations).

Figure 9:
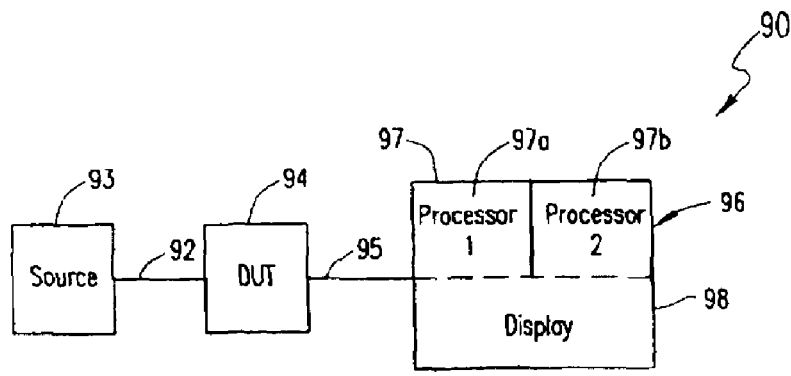
FIG. 9 is a block diagram that schematically illustrates an apparatus for determining at least one characteristic of a digital data signal utilizing Eye Diagram analysis according to an embodiment of the present invention.

FIG. 9 is a block diagram that schematically illustrates apparatus 90 for determining characteristics of a digital data signal according to an embodiment of the present invention. As shown in FIG. 9, digital data signal 92 from signal source 93 is passed through device under test (DUT) 94. Although shown as a separate component, signal source 93 can be incorporated in certain DUT's that are capable of generating their own signal. Digital data signal 95 is output from DUT 94, and an Eye Diagram representing digital data signal 95 is generated by a sampling apparatus 96. Sampling apparatus 96, preferably comprise a sampling oscilloscope, and includes a processor portion 97 that generates an Eye Diagram, and a display portion 98 that displays the generated Eye Diagram. By determining characteristics of output digital data signal 95 from the generated Eye Diagram, the manner in which the digital data signal 92 has been changed by the DUT can be determined.

In order to achieve selective sampling to fully construct one or more regions of an Eye Diagram, without fully constructing an entire Eye Diagram, sampling apparatus 96 is preferably able to control both the timing of a sample relative to a trigger reference and the particular bit in the waveform being sampled. As described previously, a sampling oscilloscope already includes the capability of controlling sample timing relative to the trigger; and this capability is represented in FIG. 9 by first processor portion 97a. To control a particular bit in a waveform being sampled requires that the pattern generator used to drive the DUT be controlled or, alternatively, that the trigger be generated from a controlled pattern detector, from a known fixed pattern triggered with long programmed delays in the sampling apparatus or with a counter set to the length of the pattern. The capability of controlling a particular bit in a waveform being sampled is represented in FIG. 9 by second processor portion 97b.

Figure 10:
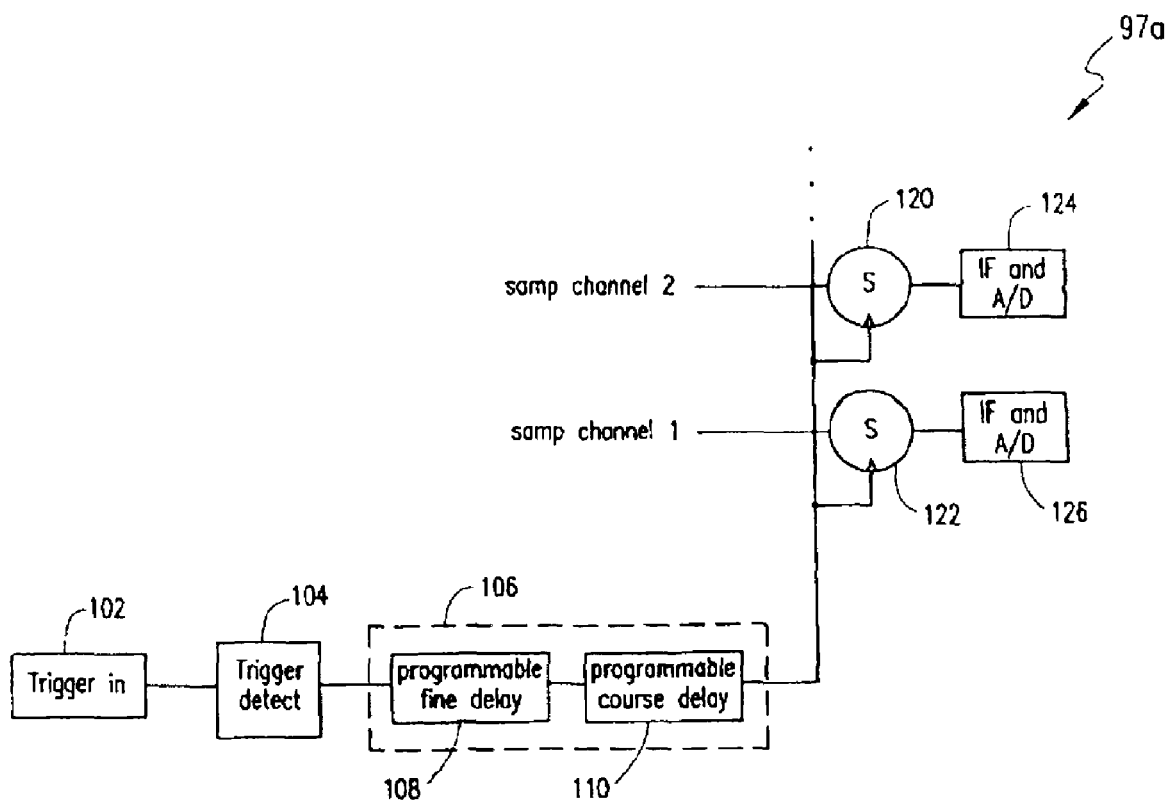
FIG. 10 is a block diagram that schematically illustrates details of the processor of the apparatus of FIG. 9.

FIG. 10 illustrates details of processor portion 97a of sampling apparatus 90 for generating an Eye Diagram in an equivalent-time sampling system, according to an embodiment of the present invention. Processor portion 97a utilizes a sequential timebase that detects a synchronous trigger event (such as, for example, a rising edge or a falling edge in an applied trigger signal 102) via trigger detect unit 104, and generates a precision programmable delay between the trigger event and a sample strobe of the trigger detect unit via precision delay generator 106. Precision delay generator 106 may include fine delay generator 108 and course delay generator 110. Samples are taken by sample channels 120 and 122, at varying times as determined by the timebase delay, and the taken samples are converted to digital values by A/D converters 124 and 126. (It should be understood that the apparatus illustrated in FIG. 10 is intended to be exemplary only and that the invention is not limited to the particular architecture shown. For example, processor portion 97a may have greater or fewer sample channels than two and the invention is not limited to any particular number of sample channels.)

To view and measure individual bits in a data stream, a pattern trigger is used. A pattern trigger is a trigger pulse that happens once per repetition of a pattern. For example, if a $2^7$-1 PRBS pattern is being used, the pattern generator is set up to generate a trigger pulse every 127 bits. To look at a particular bit in a bit stream, one way is to program a time delay in the precision delay generator 106 equal to the time interval between the pattern trigger and the bit of interest. In another way, the trigger pulse is aligned in time with the bit. The pattern generator knows a priori which bits in the pattern are ones and which are zeros, so it can position the pattern trigger to look specifically at a type of bit or a subpattern When patterns become long, for example, $2^{31}$-1 PRBS, the time between pattern triggers can become prohibitively long depending on the data rate. In such cases, the pattern generator can create multiple trigger pulses for each pattern, and the oscilloscope groups the data for each trigger separately. For example, if there are three trigger pulses per pattern, the scope maintains three separate databases of data, each corresponding to a different single-valued waveform (as opposed to a multi-valued Eye Diagram). This is useful if a composite of, for example, rising edges, is desired; or, if it is desirable to average the samples first before putting them together in an Eye Diagram.

If only timing relative to a clock trigger is used to select regions of an Eye Diagram to be fully constructed, only vertical slices of the Eye can be fully constructed, as opposed to any region of the Eye Diagram, and a larger number of samples are usually required to be taken. For example, when sampling for a jitter measurement, if only the crossing is sampled (i.e., the selective sampling method is used), about a ninety percent savings in samples that would be required to fully construct an entire Eye Diagram can be achieved. If only timing control is used, the one and zero levels above and below the crossing will also be sampled, requiring that a greater number of samples be taken A significant savings in sampling efficiency is still achieved in this case, however, (about an eighty percent savings) because only samples in the vertical slice that includes the crossing are required to be taken.

The regions of the Eye being sampled and the density of those regions can be adjusted dynamically while samples are being taken. If some measurement numbers have stabilized while others are still changing as more data is acquired, the remaining samples can be concentrated on the measurements that have not yet stabilized. Alternatively, an a priori knowledge of how many samples are needed for each measurement can be used to weigh different regions. Also, if a mask test is being performed, a periodic check can determine whether other regions of the Eye are drifting toward mask violations. If they are, future samples can be concentrated in those areas.

Figure 11:
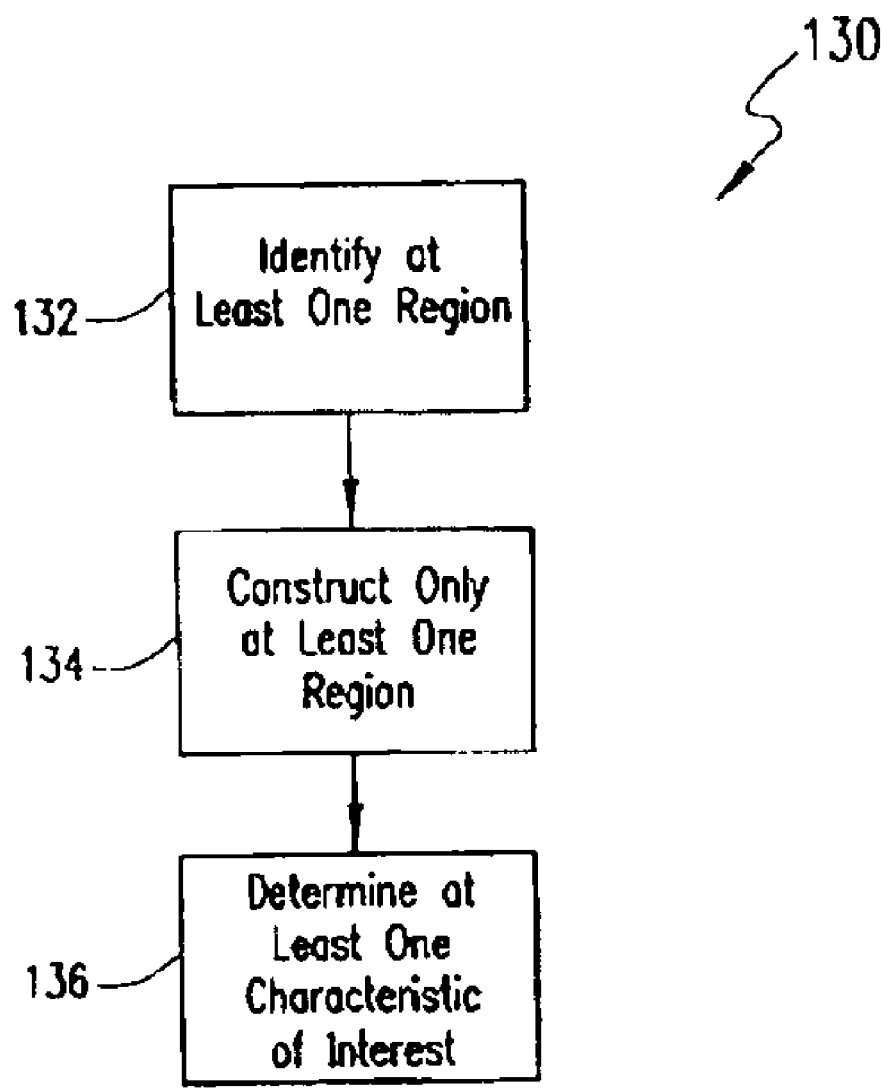
FIG. 11 is a flow chart that illustrates steps of a method for determining at least one characteristic of a digital data signal according to another embodiment of the present invention.

FIG. 11 is a flow chart that illustrates steps of a method 130 for determining at least one characteristic of a digital data signal according to an embodiment of the present invention. As illustrated, at least one region of an Eye Diagram that contains information for determining at least one characteristic of a digital data signal is identified as shown in step 132. Sufficient samples are then taken in step 134 to fully construct only the identified at least one region of the Eye Diagram without fully constructing the entire Eye Diagram. The at least one characteristic of interest of the digital data signal is then determined from the fully constructed at least one region in step 136.

While what has been described constitutes exemplary embodiments of the present invention, it should be recognized that the invention can be varied in many respects without departing therefrom For example, although the invention has been described primarily in connection with Eye Diagrams, the present invention can also be used to determine characteristics of a digital data signal by fully constructing one or more regions of other waveforms such as single-value wave forms. Because the invention can be varied in may ways, it should be understood that the invention should be limited only insofar as is required by the scope of the following claims.

I claim:

1. A method for determining at least one characteristic of a digital data signal, comprising:

selecting at least one characteristic of interest of a digital data signal;

identifying at least one region of a waveform that contains information for determining said selected at least one characteristic of interest of the digital data signal;

taking sufficient samples of the digital data signal to fully construct only the identified at least one region of the waveform without fully constructing the entire waveform; and determining the at least one characteristic of interest from the fully constructed at least one region of the waveform.

2. The method according to claim 1, wherein the identifying step comprises identifying at least one region of the waveform that contains at least one feature for determining the selected at least one characteristic of interest, and the determining step comprises measuring the at least one feature to determine the selected at least one characteristic of interest of the digital data signal.

3. The method according to claim 1, and further including the step of taking a limited number of samples of the digital data signal to roughly construct the entire waveform prior to identifying the at least one region of the waveform.

4. The method according to claim 1, wherein said step of taking sufficient samples comprises taking samples by controlling a timing of samples relative to a trigger reference that is synchronous to the digital data signal.

5. The method according to claim 1, wherein said step of taking sufficient samples comprises sampling particular bits in the digital data signal.

6. The method according to claim 1, wherein said step of taking sufficient samples comprises taking samples by controlling a timing of samples relative to a trigger reference that is synchronous to the digital data signal, and sampling particular bits in the digital data signal.

7. The method according to claim 1, wherein said waveform comprises a single-value waveform.

8. The method according to claim 1, wherein said waveform comprises an Eye Diagram.

9. The method according to claim 8, wherein said at least one characteristic of interest comprises at least one of extinction ratio, contrast ratio, overshoot, undershoot, one and zero level, signal-to-noise ratio, risetime, falltime, bit rate, crossing percentage, jitter, duty cycle distortion, Eye height, Eye width, Eye amplitude and optical modulation amplitude.

10. The method according to claim 8, wherein said identifying step comprises identifying at least one region of the Eye Diagram that is close to at least one mask region superimposed on said Eye Diagram, and wherein said determining step comprises determining the at least one characteristic of interest of the digital data signal with respect to the at least one mask region.

11. The method according to claim 10, wherein said determining step comprises determining if said at least one region of said Eye Diagram violates a mask region.

12. The method according to claim 11, wherein each said at least one mask region includes a mask and a mask margin, and wherein said determining step comprises determining if said at least one region of said Eye Diagram overlaps a mask or a mask margin.

13. A method for determining at least one characteristic of a digital data signal, comprising:
   selecting at least one characteristic of interest of a digital data signal;
   identifying at least one region of an Eye Diagram that contains at least one feature for determining the selected at least one characteristic of interest of the digital data signal,
   taking sufficient samples of the digital data signal to fully construct only the identified at least one region of the Eye Diagram without fully constructing the entire Eye Diagram; and
   measuring the at least one feature to determine the selected at least one characteristic of interest of the digital data signal.

14. The method according to claim 13, wherein said selected at least one characteristic of interest comprises at least one of extinction ratio, contrast ratio, overshoot, undershoot, one and zero level, signal-to-noise ratio, risetime, falltime, bit rate, crossing percentage, jitter, duty cycle distortion, Eye height, Eye width, Eye amplitude and optical modulation amplitude.

15. The method according to claim 13, further including the step of taking a limited number of samples of said digital data signal to roughly construct the entire Eye Diagram prior to identifying the at least one region of the Eye Diagram.

16. The method according to claim 13, wherein said step of taking sufficient samples comprises taking samples by controlling a timing of samples relative to a trigger reference that is synchromous to the digital data signal.

17. The method according to claim 13, wherein said step of taking sufficient samples comprises sampling particular bits in the digital data signal.

18. The method according to claim 13, wherein said step of taking sufficient samples comprises taking samples by controlling a timing of samples relative to a trigger reference that is synchronous to the digital data signal, and sampling particular bits in the digital data signal.

19. A method for determining at least one characteristic of a digital data signal, comprising:
   identifying at least one region of an Eye Diagram that is close to at least one mask region superimposed on the Eye Diagram;
   taking sufficient samples of the digital data signal to fully construct only the identified at least one region of the Eye Diagram without fully constructing the entire Eye Diagram; and
   determining at least one characteristic of interest of the digital data signal with respect to the at least one mask region.

20. The method according to claim 19, wherein said determining step comprises determining if the at least one characteristic of interest violates a mask region.

21. The method according to claim 19, wherein each said at least one mask region includes a mask and a mask margin, and wherein said determining step comprises determining if said at least one region of said Eye Diagram overlaps a mask or a mask margin.

22. The method according to claim 19, and further including the step of taking a limited number of samples of the digital data signal to roughly construct the entire Eye Diagram prior to identifying the at least one region of the Eye Diagram.

23. Apparatus for determining at least one characteristic of a digital data signal, comprising:
   a sampling apparatus having a display for displaying a waveform that represents said digital data signal; and
   a processor for controlling a taking of samples of the digital data signal to control generation of the waveform on the display, the processor including a first processor portion for controlling a timing of samples taken relative to a trigger reference, and a second processor portion for controlling particular bits to be sampled, for permitting only a selected region or regions of the waveform to be fully constructed and displayed on the display of the sampling device without fully constructing the entire waveform.

24. The apparatus according to claim 23, wherein said sampling apparatus comprises a sampling oscilloscope.

25. The apparatus according to claim 24, wherein said sampling oscilloscope comprises an equivalent-time sampling oscilloscope.

26. The apparatus according to claim 23, wherein said waveform comprises a single-value waveform.

27. The apparatus according to claim 23, wherein said waveform comprises an Eye Diagram.

* * * * *